United States Patent [19]

Taniguti

[11] Patent Number: 4,542,468
[45] Date of Patent: Sep. 17, 1985

[54] GROUND DETECTION ARRANGEMENT FOR AN A.C. GENERATOR

[75] Inventor: Ryosuke Taniguti, Nagasaki, Japan

[73] Assignee: Mitsubishi Denki Kabushiki Kaisha, Japan

[21] Appl. No.: 405,283

[22] Filed: Aug. 4, 1982

[30] Foreign Application Priority Data

Aug. 7, 1981 [JP] Japan ................................. 56-124883

[51] Int. Cl.$^4$ ..................... G06G 7/62; G08B 21/00
[52] U.S. Cl. .................................... 364/481; 324/51; 340/648; 340/650; 361/50; 364/550
[58] Field of Search ............... 364/481, 483, 492, 550, 364/551, 734; 324/51, 52, 158 MG; 340/292, 648, 650, 660, 664, 659; 318/142, 144; 322/99; 361/42, 50

[56] References Cited

U.S. PATENT DOCUMENTS

| | | | |
|---|---|---|---|
| 3,303,410 | 2/1967 | Hoover et al. | 322/99 |
| 3,746,979 | 7/1973 | Kildishev et al. | 322/99 |
| 4,000,464 | 12/1976 | Nüssel | 361/42 |
| 4,138,706 | 2/1979 | Johnson et al. | 361/42 |
| 4,187,525 | 2/1980 | Nagura et al. | 364/482 X |
| 4,214,311 | 7/1980 | Nakashima et al. | 364/482 |

*Primary Examiner*—Errol A. Krass
*Assistant Examiner*—Kevin J. Teska
*Attorney, Agent, or Firm*—Leydig, Voit & Mayer

[57] ABSTRACT

The present invention relates to a ground detection arrangement for an A.C. generator in which positive and negative D.C. voltages are alternately applied to the neutral point of an armature winding so as to detect voltages proportional to ground currents corresponding to the respective D.C. voltages, and the average of the sum of the absolute values of both the detected voltages is compared with a reference value thereby to detect the existence of grounding, whereby the existence of the grounding can be detected without being affected by the grounding position of a field winding.

3 Claims, 3 Drawing Figures

GROUND DETECTION ARRANGEMENT FOR AN A.C. GENERATOR

BACKGROUND OF THE INVENTION

This invention relates to a ground detection arrangement for an A.C. generator.

FIG. 1 illustrates an example of a conventional arrangement of the type of the present invention.

In FIG. 1, numeral 1 denotes a brushless A.C. generator, numeral 2 an armature winding, numeral 3 a three-phase full-wave rectifier, numeral 4 a field winding and numeral 5 an insulation resistance detector. The insulation resistance detector 5 includes both a D.C. voltage source (voltage E) 8 and current relay 9 for the direct current introduced across a brush 6 and a slip ring 7 in between the neutral point C of armature winding 2 and the ground A. If the ground resistance (insulation resistance) $R_s$ is reduced to cause a current exceeding the critical reference value, the current relay 9 is actuated. Numeral 10 denotes a protection resistor.

In such a conventional device, however, the current value $I_{sp}$ in case of the grounding occurring on the side of positive pole in field winding 4 and the current value $I_{sn}$ in the case of the grounding occurring on the side of the negative pole N are different from each other as follow:

$$I_{sp} = \frac{E - \frac{1}{2}E_f}{R_i + R_s} \quad (1)$$

$$I_{sn} = \frac{E + \frac{1}{2}E_f}{R_i + R_s} \quad (2)$$

where:
$E_f$ = Voltage of field winding
$R_i$ = Resistance value of the protection resistor Therefore, conventional devices do not allow for correct detection of the existence of grounding in the field winding 4.

SUMMARY OF THE INVENTION

The present invention has been introduced in order to eliminate the disadvantage described above, and has for its object to provide a ground detection arrangement for an A.C. generator in which positive and negative D.C. voltages are alternately applied to the neutral point of an armature winding so as to detect voltages proportional to ground currents corresponding to the respective D.C. voltages, and the average of the sum of the absolute values of both the detected voltages is compared with a predetermined reference value thereby detecting the existence of grounding in the field winding, whereby the existence of the grounding can be detected without being affected by the grounding position of the field winding.

BRIEF DESCRIPTION OF THE DRAWINGS

In the drawings, the same symbols indicate the same or corresponding parts.

DESCRIPTION OF THE PREFERRED EMBODIMENT

Figure 1:
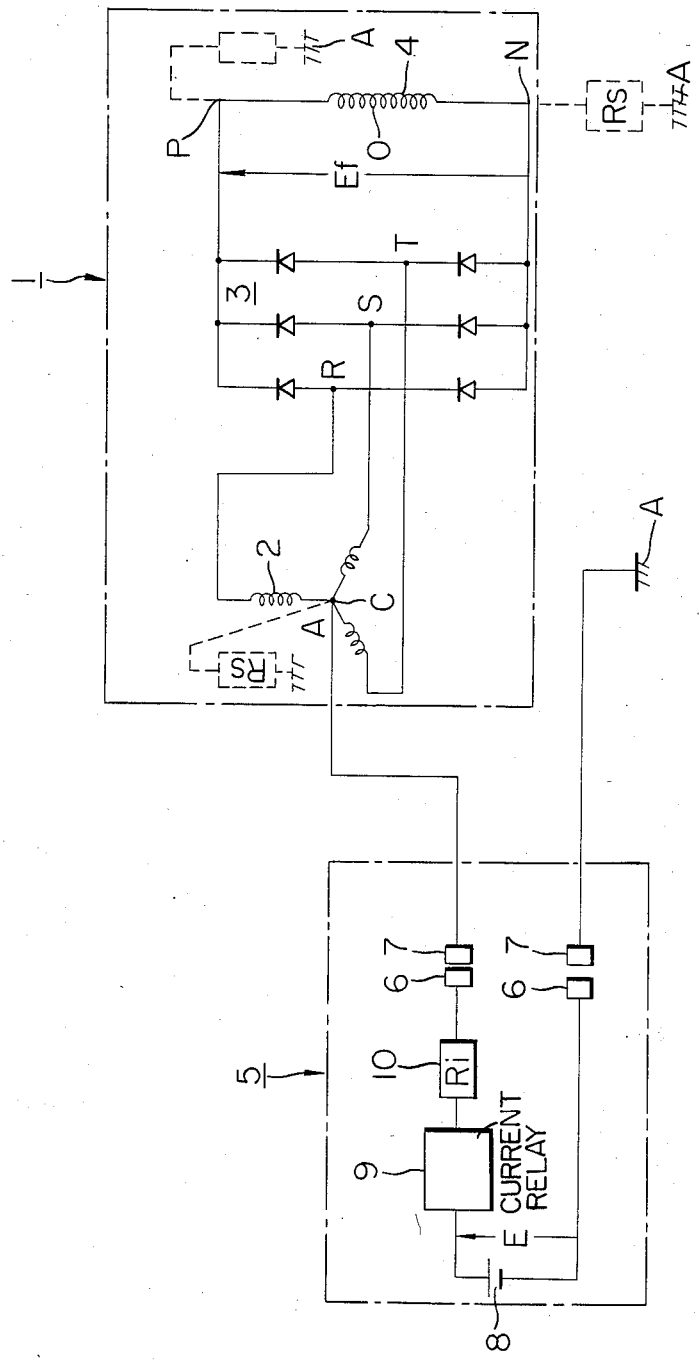
FIG. 1 is a circuit diagram of a ground detection arrangement for an A.C. generator in a prior art.
Figure 2:
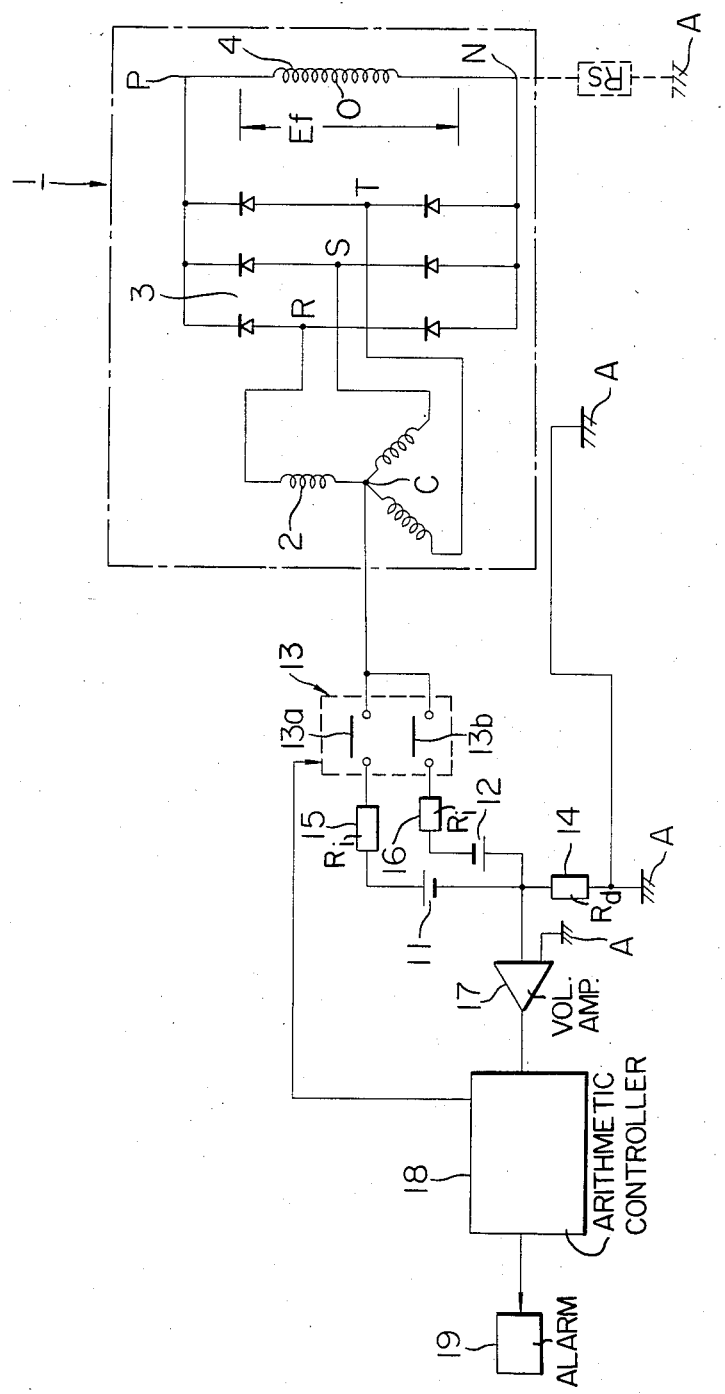
FIG. 2 is a circuit diagram of a ground detection arrangement for an A.C. generator according to the present invention.

Referring to FIG. 2, D.C. sources 11 and 12 are connected to the neutral point C of an armature winding 2 through the contacts 13a and 13b of a change-over switch 13, respectively. A detection resistor 14 is inserted between both the D.C. sources 11, 12 and the ground A. Numerals 15 and 16 indicate protective resistors having a high resistance $R_i$. A detected voltage $E_d$ developing across the detection resistor 14 is applied to an analog input type arithmetic controller 18 through a voltage amplifier 17. The arithmetic controller 18 executes the below-mentioned calculation, compares the calculated result with a reference value and transmits an alarm signal to an alarm device 19. It also provides a control signal for changing-over the contacts 13a and 13b of the change-over switch 13 at regular time intervals.

The arithmetic controller 18 calculates the average value $\overline{E_d}$ of the sum between the absolute value of the detected voltage $E_{d+}$ developing across the detector resistor 14 upon the application of the voltage $+E$ of the D.C. source 11 to the neutral point C of the armature winding 2 and the absolute value of the detected voltage $E_{d-}$ developing across the detection resistor 14 upon the application of the voltage $-E$ of the D.C. source 12. When the average value $\overline{E_d}$ is found smaller than the reference value by the comparison, the alarm signal is transmitted.

Since, as stated before, the ground current at the grounding of the field winding 4 differs depending upon the ground point, also the detected voltage which is the product between the ground current and the resistance value $R_d$ of the detecting resistor 14 changes depending upon the ground point. In contrast, the average value $\overline{E_d}$ becomes as follows and has the influence of the voltage $E_f$ of the field winding:

$$\overline{E_d} = \left( \frac{E - \frac{1}{2}E_f}{R_i + R_s + R_d} + \frac{E + \frac{1}{2}E_f}{R_i + R_s + R_d} \right) \times \frac{R_d}{2} \quad (3)$$

$$= \frac{E}{R_i + R_s + R_d} \cdot R_d$$

Since $R_i$ and $R_d$ are constants, $\overline{E_d}$ varies in accordance with the change of the ground resistance $R_s$. Accordingly, wherever the ground point lies, the alarm signal is transmitted when the substantial grounding has occurred and the ground resistance $R_s$ has been decreased to a dangerous level.

In the above, there has been described the case where the average value $\overline{E_d}$ of the sum of the absolute values of the detected voltages is compared with the predetermined value (voltage). However, it is also possible to calculate the value of the ground resistance $R_s$ from the average value $\overline{E_d}$ of the sum of the absolute values according to the following equation and to transmit the alarm signal when the resistance $R_s$ has become lower than a predetermined reference value (resistance):

$$R_s = \left( \frac{E}{E_d} - 1 \right) \cdot R_d - R_i \qquad (4)$$

As set forth above, according to this invention, positive and negative D.C. voltages which are alternately switched and applied across the neutral point of an armature winding and the ground, ground currents are converted into and detected as voltages by a detection resistance, and the average value of the sum of the absolute values of the detected voltages at the application of the respective positive and negative D.C. voltages is calculated and then compared with a reference value by means of an arithmetic controller to detect the existence of grounding in the field winding. Hence, influence due to different ground positions of the field winding can be eliminated, so that the existence of the substantial grounding can be detected more accurately than in the prior art.

Figure 3:
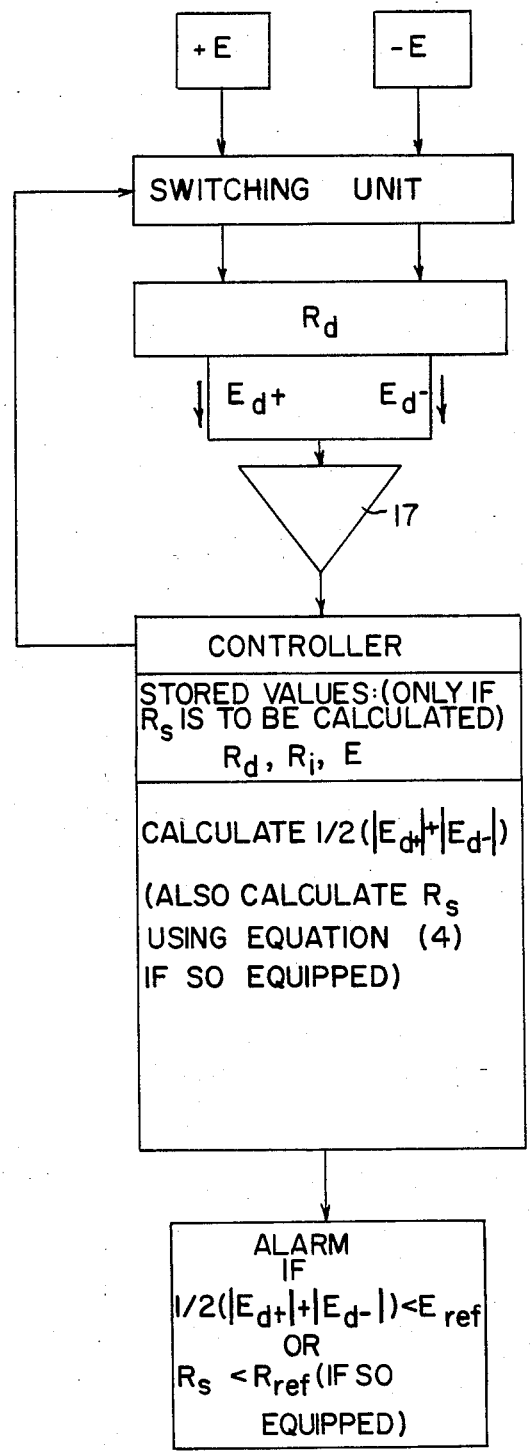
FIG. 3 is a flow diagram to explain the steps followed in determining the grounding and the values of insulation resistance (if so equipped).

In summary, referring to the flow diagram of FIG. 3, $E_{d+}$ and $E_{d-}$ are detected as the voltages across the resistor $R_d$ and are alternatively fed into the amplifier 17 which serves as a combiner at a frequency which is controlled by the controller. The combiner feeds the combined (mixed) voltages to the controller. (Values of $R_d$, $R_i$ and E are stored in the controller if $R_s$ is to be calculated). The controller calculates the average of the sum of the absolute voltage values $\frac{1}{2}(|E_{d+}| + |E_{d-}|)$ and $R_s$ using equation (4) based on the calculated average and the stored values $R_d$, $R_i$ and E. An alarm is actuated if the average of the sum of the absolute voltage values is less than a predetermined reference value or when $R_s$ is less than a predetermined reference value.

What is claimed is:

1. A ground detection arrangement for an A.C. generator comprising:
    a high resistance element ($R_i$) connected to a neutral point of an armature winding of an A.C. generator;
    a D.C. voltage source of positive and negative D.C. voltages applied alternately to the neutral point of said armature winding through said high resistance element ($R_i$);
    a detecting resistor connected between said D.C. voltage source and the ground of the circuit arrangement; and
    an arithmetic controller including means for calculating an average voltage value of a sum of absolute values of D.C. voltage values of positive and negative polarities developed across said detecting resistor and for comparing the average voltage value with a reference voltage value, thereby to detect existence of grounding in the field winding of the A.C. generator.

2. A ground detection arrangement for an A.C. generator as defined in claim 1, wherein said arithmetic controller transmits the alarm signal when the average voltage value of the absolute values has become greater than a predetermined reference value.

3. A ground detection arrangement for an A.C. generator as defined in claim 1, wherein said arithmetic controller transmits the alarm signal when an value of a ground resistance calculated by the controller, based on the average voltage value of the absolute values has become smaller than a predetermined reference value.

* * * * *